(12) United States Patent
Jacobs et al.

(10) Patent No.: US 8,675,172 B2
(45) Date of Patent: Mar. 18, 2014

(54) LITHOGRAPHIC APPARATUS AND METHOD OF REMOVING LIQUID

(75) Inventors: Hernes Jacobs, Rossum ov (NL); Erik Roelof Loopstra, Heeze (NL); Michel Riepen, Veldhoven (NL); Eva Mondt, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 797 days.

(21) Appl. No.: 12/709,278

(22) Filed: Feb. 19, 2010

(65) Prior Publication Data

US 2010/0208224 A1    Aug. 19, 2010

Related U.S. Application Data

(63) Continuation of application No. 11/708,686, filed on Feb. 21, 2007, now Pat. No. 7,692,765.

(51) Int. Cl.
*G03B 27/42* (2006.01)
*G03B 27/52* (2006.01)
*G03B 27/58* (2006.01)

(52) U.S. Cl.
USPC .............................. 355/53; 355/30; 355/72

(58) Field of Classification Search
USPC ........................................ 355/53, 30, 72, 77
See application file for complete search history.

(56) References Cited

U.S. PATENT DOCUMENTS

| 4,509,852 A | 4/1985 | Tabarelli et al. |
| 2004/0160582 A1 | 8/2004 | Lof et al. |
| 2006/0119813 A1 | 6/2006 | Hultermans et al. |
| 2006/0139593 A1 | 6/2006 | Nagasaka et al. |
| 2006/0290908 A1* | 12/2006 | De Graaf et al. ............... 355/53 |
| 2007/0268466 A1 | 11/2007 | Leenders et al. |
| 2008/0007704 A1 | 1/2008 | Leenders et al. |
| 2008/0062393 A1 | 3/2008 | Mulkens |
| 2008/0192214 A1 | 8/2008 | Leenders et al. |
| 2008/0198344 A1 | 8/2008 | Jacobs et al. |

FOREIGN PATENT DOCUMENTS

| EP | 1 420 298 A2 | 5/2004 |
| EP | 1 420 300 A2 | 5/2004 |
| EP | 1429188 | 6/2004 |
| JP | 2004-289127 | 10/2004 |
| JP | 2006-120889 | 5/2006 |
| JP | 2006-165587 | 6/2006 |
| JP | 2007-318117 | 12/2007 |
| WO | WO 99/49504 | 9/1999 |
| WO | 2005-020299 | 3/2005 |
| WO | WO 2005/064405 A2 | 7/2005 |

OTHER PUBLICATIONS

Japanese Office Action dated Oct. 4, 2010 in related Japanese patent application No. 2008-032818.

* cited by examiner

*Primary Examiner* — Peter B Kim
(74) *Attorney, Agent, or Firm* — Pillsbury Winthrop Shaw Pittman LLP

(57) ABSTRACT

A method of removing liquid from a substrate supported on a substrate table and from a gap between the substrate and the substrate table includes: providing a liquid removal device with at least one outlet connected to an under pressure source, the outlet forming an elongated extractor of a predetermined geometry; relatively moving the substrate table and the liquid removal device such that the extractor is adapted to pass over all of the substrate and gap and such that substantially at any given time any local part of the extractor at the edge of a non-dried portion of the gap has, in a plane, its local tangent orientated at an angle of between about 35° and 90° to the local tangent of the gap.

20 Claims, 5 Drawing Sheets

LITHOGRAPHIC APPARATUS AND METHOD OF REMOVING LIQUID

The present application is a continuation of U.S. patent application Ser. No. 11/708,686 filed on Feb. 21, 2007 now U.S. Pat. No. 7,692,765, now allowed, from which benefit is claimed under 35 U.S.C. §120. The entire contents of this application is herein fully incorporated by reference.

FIELD

The present invention relates to a lithographic apparatus and a method for removing liquid.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that is accelerated during a scanning exposure. This may require additional or more powerful motors, and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2, the liquid is supplied along the direction of movement of the substrate relative to the final element of the projection system PL, though this does not need to be the case. Various orientations and numbers of in- and out-lets positioned around the final element are possible, one example is illustrated in FIG. 3 in which four sets of an inlet with an outlet on either side are provided in a regular pattern around the final element.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system PL in the XY plane though there may be some relative movement in the Z direction (in the direction of the optical axis). A seal is formed between the seal member and the surface of the substrate. Preferably the seal is a contactless seal such as a gas seal. Such as system with a gas seal is disclosed in EP-A-1,420,298, hereby incorporated in its entirety by reference, and illustrated in FIG. 5.

The liquid confinement structure 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11.

In EP-A-1,420,300, hereby incorporated in its entirety by reference, the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

Another way of performing immersion lithography is disclosed in, for example, WO 2005/064405, hereby incorporated in its entirety by reference. In this method the whole of the top surface of the substrate W is allowed to be covered in immersion liquid. The level of immersion liquid under the projection lens is kept higher than elsewhere by a liquid constraining unit, but no particular effort is made to confine liquid just to the localized area of the substrate under the projection lens. Another way of thinking of this is that the seal member of FIG. 5 is allowed to leak liquid between it and the substrate. Thus, it becomes desirable to dry the substrate W (and the top surface of the substrate table or any sensors which may have been covered in immersion liquid) prior to removing the substrate from the substrate table for further processing.

In the above mentioned system, liquid can find its way into a gap between the substrate table and the substrate which is supported on the substrate table. Specifically, the top surface of the substrate table and the substrate are substantially coplanar so that the substrate sits in a recess in the substrate table. The outer circumference of this recess is slightly larger than the outer circumference of the substrate to account for variations in the size of the substrate. This is the origin of the gap.

SUMMARY

It is desirable to provide a system for removing liquid from the substrate table, in particular from a gap between the substrate table and the substrate.

According to an embodiment of the invention, there is provided an immersion lithographic apparatus including: a substrate table including a recess to position a substrate therein; a liquid removal device with at least one outlet, connectable to an under pressure source, forming an elongated extractor of predetermined geometry; and a controller configured to relatively move the substrate table and the liquid removal device such that the extractor is adapted to pass over all of the recess and such that substantially, at any given time, any local part of the edge of the recess, which is being passed over by the extractor for the first time has, in a plane, its local tangent orientated at an angle of between about 20° and 90° relative to the local tangent of the local part of the extractor positioned over the local part of the edge at that given time.

According to an embodiment of the invention, there is provided an immersion lithographic apparatus including: a substrate table configured to support a substrate in a recess, a gap existing between the substrate and substrate table; a liquid removal device including: at least one outlet connectable to an under pressure source forming an elongated extractor; and flow restricting surfaces extending either side of the extractor, the flow restricting surfaces being substantially parallel to a top surface of the substrate table and the substrate; and a controller configured to relatively move the substrate table and the liquid removal device such that when the extractor is positioned over the gap the gas flow resistance from the surrounding atmosphere of the extractor between the flow restricting surfaces and the substrate and/or substrate table is greater than along the gap so as, in use, to generate a gas flow along the gap towards the outlet during extraction of liquid from the top surface of the substrate and/or substrate table and gap.

According to an embodiment of the invention, there is provided a method of removing liquid from a substrate supported on a substrate table and from a gap between the substrate and the substrate table, the method including: providing a liquid removal device with at least one outlet connected to an under pressure source, the outlet forming an elongated extractor of a predetermined geometry; relatively moving the substrate table and the liquid removal device such that the extractor passes over all of the substrate and gap and such that substantially, at any given time, any local part of the extractor at the edge of a non-dried portion of the gap has, in a plane, its local tangent orientated at an angle of between about 20° and 90° relative to the local tangent of the gap.

According to an embodiment of the invention, there is provided a method of removing liquid from a gap between a substrate and a substrate table, the method including: providing a liquid removal device with at least one outlet which is attached to an under pressure source; and orientating and moving the liquid removal device relative to the gap so as to generate a gas flow along the gap towards the outlet and towards liquid in the gap adjacent the outlet.

In an embodiment of the invention, a lithographic apparatus includes an illumination system configured to condition a beam of radiation; a pattern support configured to support a patterning device, the patterning device configured to pattern the beam of radiation to form a patterned beam of radiation; a substrate table configured to hold a substrate, the substrate and the substrate table defining a gap therebetween; a projection system configured to project the patterned beam of radiation onto the substrate; a fluid supply system configured to provide fluid in the space between a final element of the projection system and the substrate; a liquid removal device including an outlet connectable to an under pressure source, the outlet forming an elongated extractor, the liquid removal device and the substrate table movable relative to each other such that when the extractor is positioned over any portion of the gap defined between the substrate table and the substrate, a tangent to the portion of the gap defines an angle between about 20° and 90° relative to a tangent to the elongated extractor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
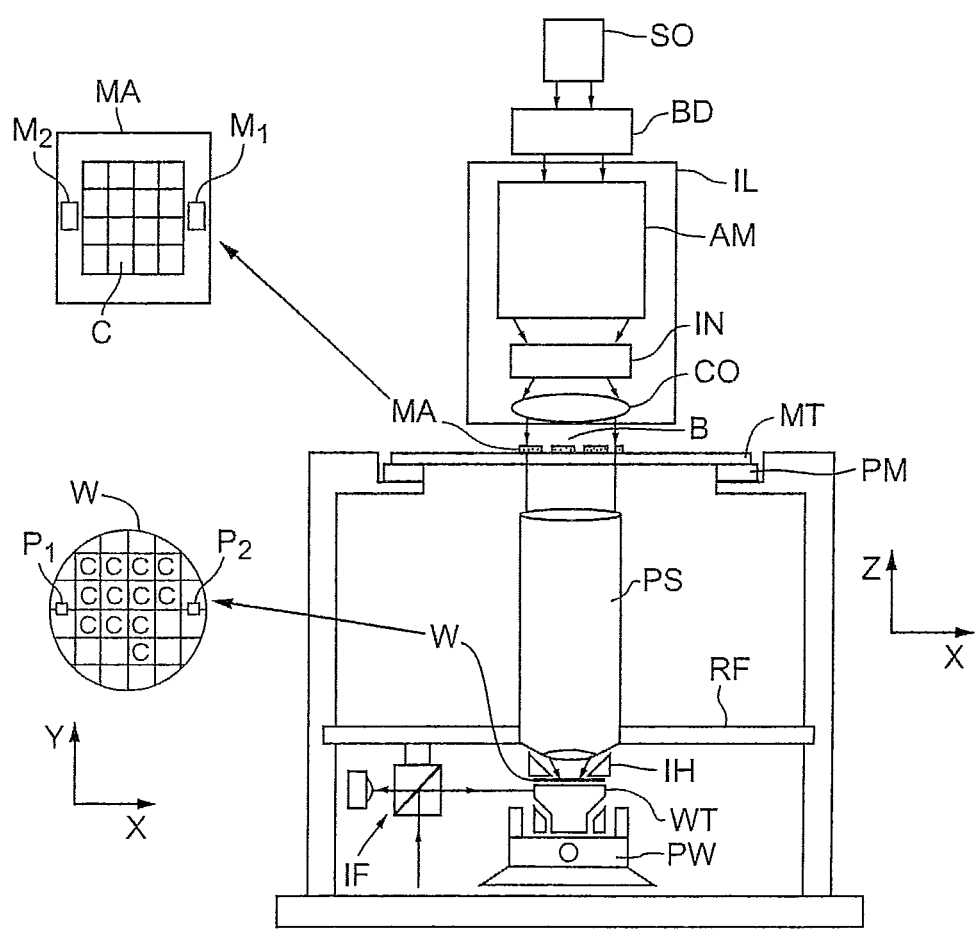
FIG. 1 depicts a lithographic apparatus according to an embodiment of the invention.
Figure 2:
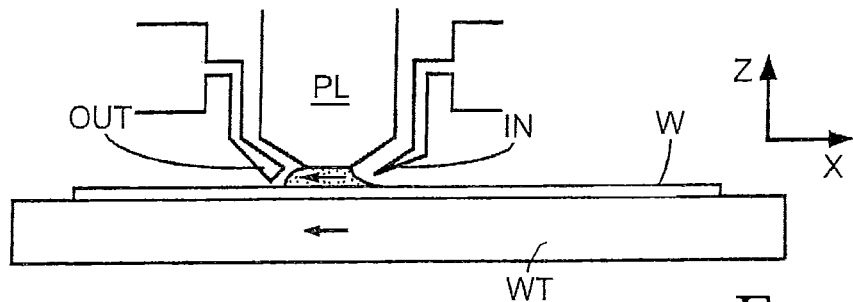
FIGS. 2 and 3 depict a conventional liquid supply system used in a lithographic projection apparatus.
Figure 3:
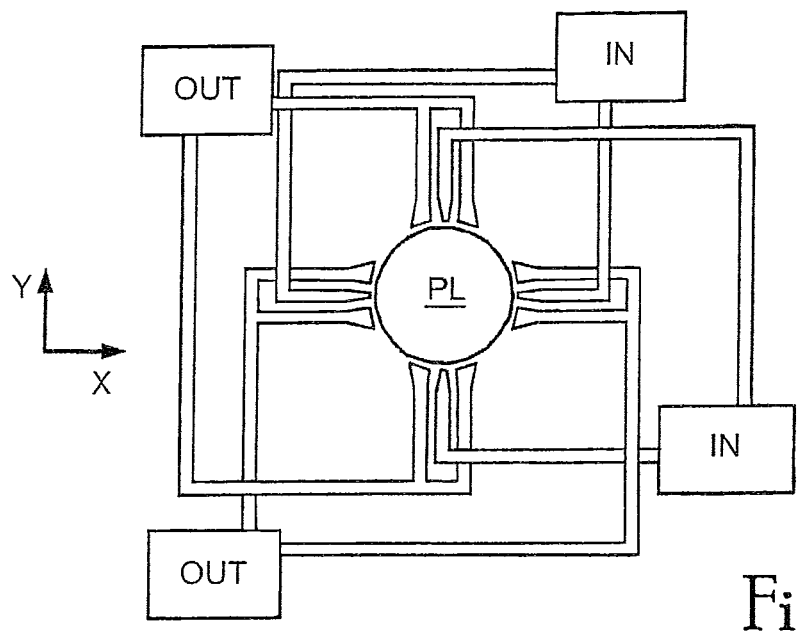
Figure 4:
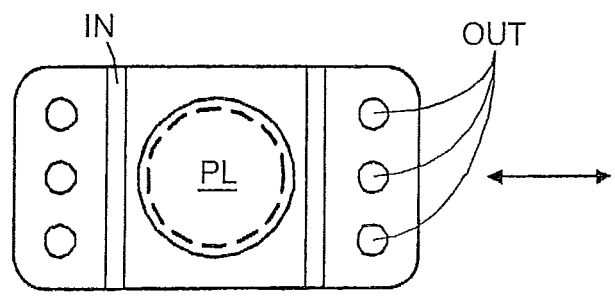
FIG. 4 depicts a conventional liquid supply system used in a lithographic projection apparatus.
Figure 4:
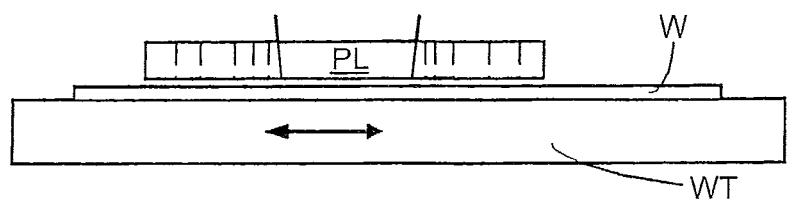
Figure 5:
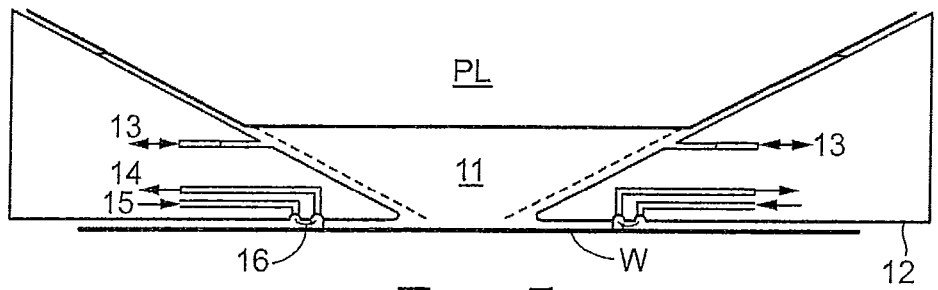
FIG. 5 depicts, in cross-section, a liquid supply system.

FIG. 1 schematically depicts a lithographic apparatus according to one embodiment of the invention. The apparatus includes an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W. The projection system PS is supported on a reference frame RF.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device, the design of the lithographic apparatus, and other conditions, such as for example whether or not the patterning device is held in a vacuum environment. The support structure MT (e.g., mask table) can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device. Having traversed the patterning device MA, the radiation beam B passes through the projection system PS, which focuses the beam onto a target portion C of the substrate W. An immersion hood IH, which is described further below, supplies immersion liquid to a space between the final element of the projection system PS and the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA (e.g., mask), the mask alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments of the present invention are particularly useful for liquid immersion systems in which the whole of the top surface of the substrate W is allowed to be covered in immersion liquid (see for example WO 2005/064405). However, embodiments of the present invention are also applicable to other types of immersion system where drying is needed, in particular any types where liquid is trapped in a gap, for example, between a substrate and a substrate table WT.

Figure 6A:
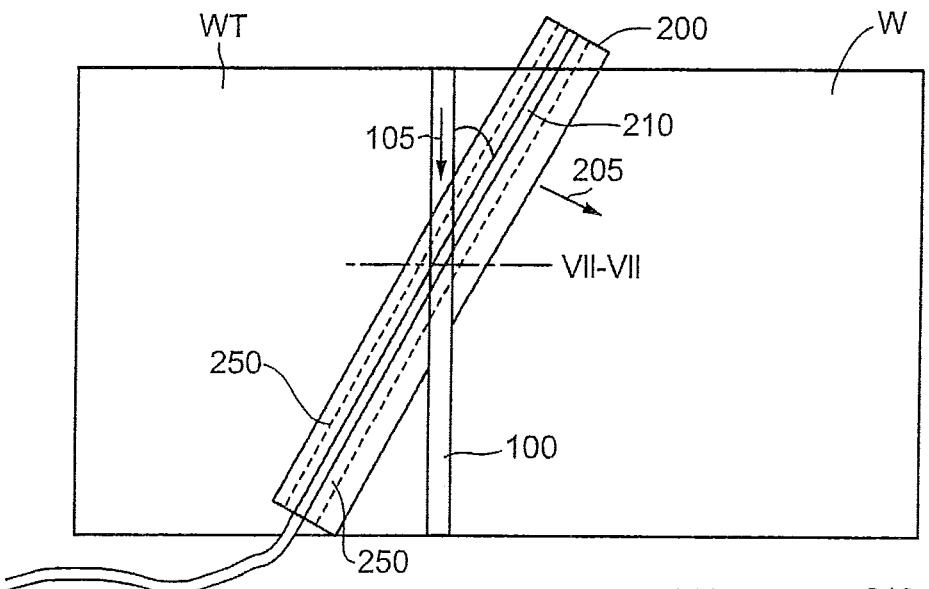
FIGS. 6a and 6b illustrate a top view of a liquid removal device, in use, in accordance with an embodiment of the present invention.

FIG. 6a shows a top view, in plane, of a liquid removal device 200 in accordance with an embodiment of the present invention. A gap 100 is present between a substrate W and a substrate table WT to allow for variations in substrate size. The substrate W is positioned in a recess in the substrate table WT so that the top surface of the substrate W and substrate table WT are substantially co-planar. The liquid removal device 200 is configured to remove liquid from a top surface of the substrate table WT (and/or the substrate W) including from the gap 100 between the substrate W and substrate table WT.

The liquid removal device 200 includes an outlet or extractor 210 which is connected to an under pressure source (not shown in FIG. 6). The outlet or extractor 210 is formed in a bottom surface of the liquid removal device 200. The bottom surface of the liquid removal device 200 includes surfaces which are substantially parallel to the top surface of the substrate W and substrate table WT on either side of the outlet 210 in the direction of relative movement 205 between the liquid removal device 200 and the substrate W and substrate table WT. These parallel surfaces are preferably co-planar and can be regarded as being two projections 250 on the underside of the liquid removal device 200. The purpose of these parallel surfaces will be described in more detail below. The under pressure vacuum may be a vacuum pump.

In FIG. 6a the outlet or extractor 210 is illustrated as being a single outlet of an elongate shape. However, the outlet may be in the form of a plurality of outlets (for example a plurality of holes) formed one next to each other to form a line. As will be described in relation to FIGS. 8 and 9, the outlet or extractor 210 does not necessarily need to be straight and therefore the line of holes does not necessarily need to be straight and it could be curved or angular. The outlet or extractor 210 may be in the form of a series of outlets as is disclosed in U.S. patent application Ser. No. 11/635,082, filed 7 Dec. 2006, hereby incorporated in its entirety, by reference in relation to the drying unit. The at least one outlet forms an extractor which is connected to an under pressure source.

The present inventors have found that if a flow of gas along the gap 100 in direction 105 towards liquid remaining in the gap, can be generated, that this greatly improves the efficiency of a liquid removal device in removing liquid from the gap. Thus, the extractor 210 or outlets of the extractor 210 are moved relative to the gap so as to generate a flow along the gap towards the outlet and towards liquid in the gap 100 adjacent to the outlet.

Figure 6B:
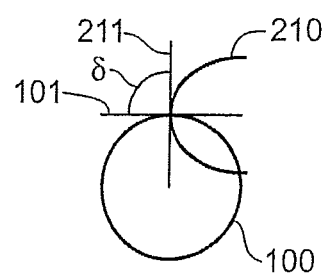

The present inventors have found that one way to generate this flow of gas 105 is to arrange the extractor 210 perpendicular to the gap 100 at its local position above the gap 100. Although a perpendicular orientation is most desired, this may not always be practical. However, the inventors have found that a sufficient flow of gas 105 can be achieved if the orientation of the tangent 211 to the local part of the extractor 210 is between an angle δ of about 20° and 90° to the local tangent 101 of the gap 100. This relative orientation is illustrated in FIG. 6b. Preferably, in an embodiment of the invention, the angle δ is between about 35 or 50° and 90°, more preferably, in an embodiment of the invention between about 70 and 90°. The angle δ is the acute angle between the two tangents 101, 211.

Figure 7:
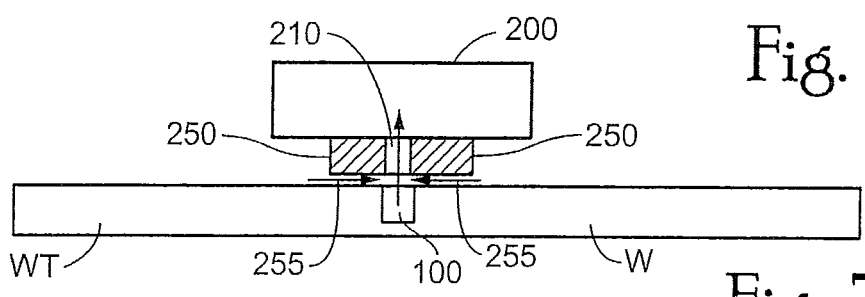
FIG. 7 illustrates a cross-section through line VII-VII in FIG. 6 of the liquid removal device according to an embodiment of the present invention.

One arrangement to achieve this is illustrated in FIGS. 6a and 7. That is, the geometry of the liquid removal device 200 is arranged such that there is a high flow resistance in the direction perpendicular to the local elongate direction (i.e. in the transverse direction) of the extractor 210 (illustrated by arrows 255 in FIG. 7). Thus, if the extractor 210 is orientated relative to the local direction of the gap 100 as illustrated in FIG. 6 (i.e. with angle δ between 20 and 90°) a lower flow resistance path will be present along the gap 100 as illustrated by arrow 105 than the path 255 illustrated in FIG. 7. Due to the lower flow resistance along the gap 100, gas from the atmosphere outside of and surrounding the extractor 210 will preferentially travel along that direction 105 towards the extractor 210 as illustrated.

In the embodiment illustrated in FIG. 6, the extractor 210 is substantially straight. Thus, in order to achieve the flow 105 and thereby efficiently extract liquid from the gap 100 it is desirable to provide a controller to ensure that at any given time during the extraction process any local part of the edge of the recess within which the substrate W lies (and which forms one edge of the gap 100), which is being passed over by the extractor 210 for the first time has, in plane, its local tangent orientated at an angle δ of between about 20 and 90° to the local tangent of the local part of the extractor positioned over the local part of the edge at that given time.

The geometry of the extractor and its position (particularly orientation and height above the substrate) are preferably chosen such that the flow resistance for gas flowing between the projections 250 and the top surface of the substrate or substrate table WT is at least 25%, preferably 50%, more preferably 75%, even more preferably 100% greater than along the gap 100.

Figure 8A:
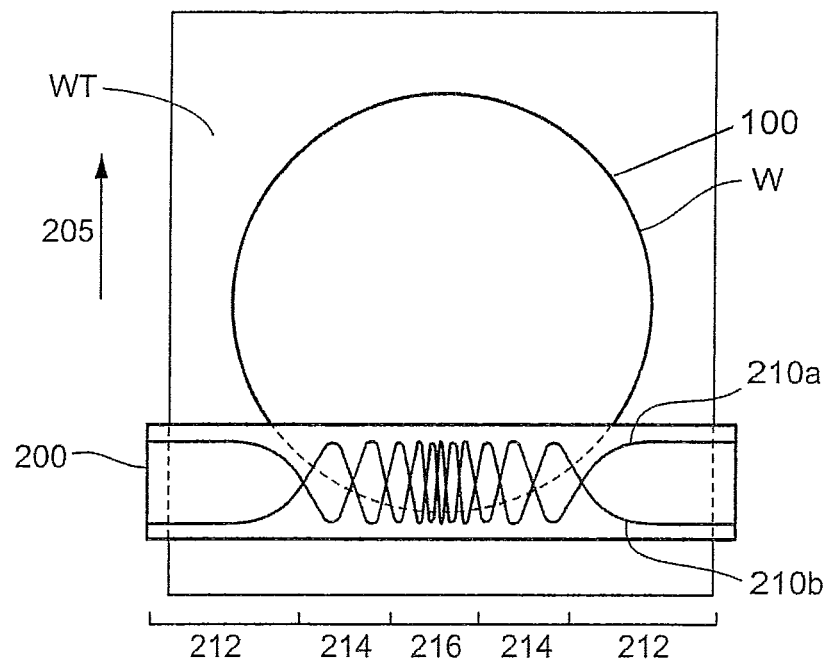
FIGS. 8a-b illustrate a top view of a liquid removal device in accordance with an embodiment of the present invention.
Figure 8B:
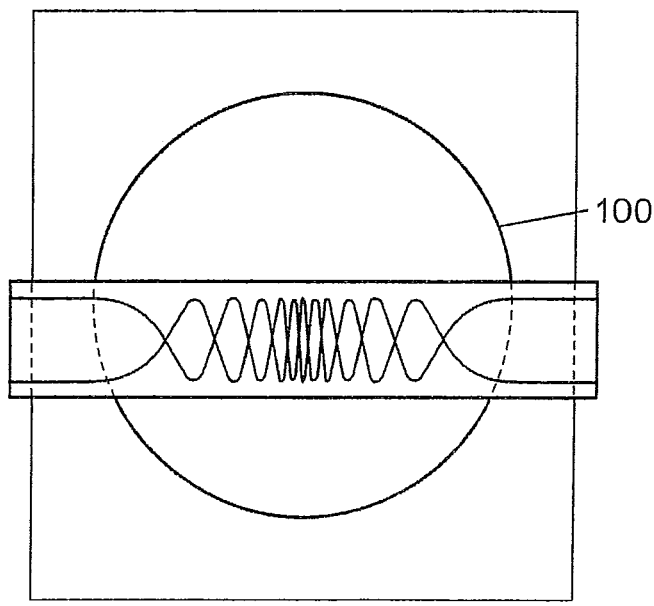
Figure 9:
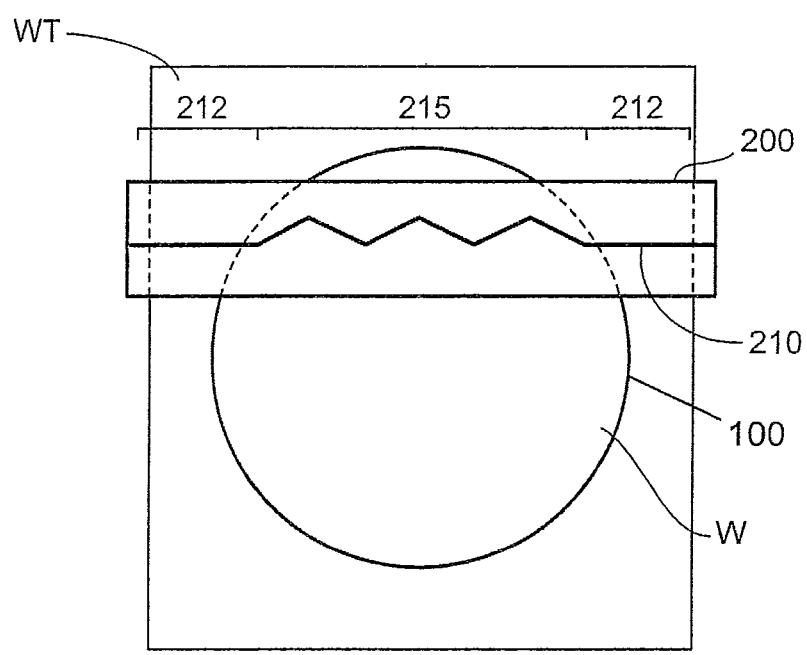
FIG. 9 illustrates a top view of a liquid removal device in accordance with an embodiment of the present invention.

It is desirable that the top surface of the substrate W can be dried at the same time as the liquid from the gap is removed. In an embodiment, a liquid removal device 200 is provided which can achieve this by relative movement over the substrate table WT in only a single relative direction to the substrate table WT. This minimizes the complexity of the movement and is also the fastest way of drying the top surface of the substrate and/or substrate table. FIGS. 8a-b and 9 illustrate one such embodiment in which the shape of the extractor 210 is designed to achieve that goal.

In FIGS. 8a-b, the extractor 210 includes two extractors 210a, 210b, one of which is used to remove liquid from the first half of the substrate W over which the extractor 200 passes and the other of which 210b is used to remove liquid from the second half of the substrate W over which the liquid removal device 200 passes.

The shape of the grooves 210a, 210b is such that the tangent of the local part of the extractor 210a, 210b over a part of the gap 100 which is being passed over is always close to about 90° to the local tangent of the gap. As can be seen in FIG. 8a, this is achieved by providing the extractors 210a, 210b with a geometry in which, in plane, the shape of the extractors 210a, 210b is sinuous with a frequency close to infinity at the centre of the substrate and decreasing to a frequency of zero at an edge of the substrate.

It can be seen that at the maximum dimension of the substrate in the width wise direction, as illustrated, the extractors 210a are nearly straight and indeed at the extremes the outer most portions 212 are substantially parallel and indeed even co-linear. Between those outer most portions 212 the extractor 210a, 210b is curved with its maximum deflection from the co-linear outer portion 212 being at a central portion 216 where the frequency of the curve form is also the greatest.

In this embodiment the centre portion 216 of the extractor lines up with the centre of the substrate W.

Between the centre portion 216 and the two outer portions 212 are middle portions 214 in which the shape of the curve changes gradually from the type of curve present in the centre portion 216 to the type of curve present at the end portions 212.

In this way, the first part of the extractor 210a to come into contact with the gap 100 is the central portion 216 at a sharpe edge. Thus, on either side of the sharpe edge the extractor 210a is nearly perpendicular to the horizontal gap 100 at the bottom of the substrate W. As the liquid removal device 200 moves up, the substrate W and the meniscus of liquid in the gap 100 moves outwards from the central portion and an air flow is generated in the gap 100 from under the central portion 216 towards the meniscus in the gap outward from the central portion. Thus, any local part of the gap 100 which is being passed over by the extractor 210a, 210b for the first time has, in plane, its local tangent orientated at an angle between 20 and 90° to the local tangent of the local part of the extractor positioned over that local part of the gap at that given time.

This can be seen with reference to FIG. 8b at which both the extractors 210a, 210b are at 90° where they cross the gap 100. In the embodiment of FIG. 8, once the liquid removal device 200 has passed about half way over the substrate W, the first extractor 210a is deactivated and the second extractor 210b is activated. In this way the rules regarding the orientation of the local tangent of the extractor to the local tangent of the gap can be maintained. Other embodiments may include more than two extractors 210a, 210b.

The shape of the extractor 210a, 210b of FIGS. 8a-b allows an efficient removal of the liquid in the gap. FIG. 9 shows an extractor of a more simple geometry which can more easily be manufactured in accordance with an embodiment of the invention. The extractor of FIG. 9 is the same as that of FIGS. 8a-b except that its shape is more simple. In the extractor of FIG. 9, two end portions 212 are co-planar and are centralized with respect to the central portion 215 of the extractor 210.

The central portion 215 of the extractor 210 between the two end portions 212 has a triangular wave form. At a position equidistant from the end portions 212, the extractor 210 is at a maximum distance (top of triangle) from the line that is co-linear with the end portions 212. This shape of extractor achieves the desired angle δ with a simple construction and using only one extractor 210.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed is:

1. An immersion lithographic apparatus comprising:
   a table including a recess to position an object therein;
   a liquid removal device including a first and a second outlet that are each connectable to an under pressure source to remove liquid through the first and the second outlet from the recess, the object or both, the first and the second outlet forming, respectively, a first and a second elongated extractor of a predetermined geometry, wherein the liquid removal device is arranged separate from a liquid confinement structure constructed and arranged to confine liquid in a space between an optical element of said immersion lithographic apparatus and the table, or the object or both; and
   a controller configured to cause relative movement between the table and the liquid removal device such that the first and the second extractor are adapted to pass over the recess,
   wherein, in use, one of the first and the second extractor is activated to remove liquid from the recess, the object or both based upon a position of the liquid removal device relative to the object.

2. The apparatus of claim 1, wherein, in use, said one of the first and the second extractor is activated when a local part of an edge of the recess, which is being passed over by the one of the first and the second extractor, has, in a plane, its local tangent orientated at an angle between about 20° and 90° relative to the local tangent of the local part of the one of the first and the second extractor positioned over the local part of the edge.

3. The apparatus of claim 1, wherein, in use, the first extractor is activated to remove liquid from a first half of the object and the second extractor is activated to remove liquid from a second half of the object.

4. The apparatus of claim 1, wherein the geometry of the first and the second extractor is such that, at any given time, a tangent of a local part of the one of the first and the second extractor over a part of the recess which is being passed over is substantially about 90° to a local tangent of the part of the recess.

5. The apparatus of claim 1, wherein the geometry of each of the first and the second extractor is sinuous.

6. The apparatus of claim 5, wherein a frequency of the sinuous geometry at a center of the extractor is greater than a frequency of the sinuous geometry at an end of the extractor.

7. The apparatus of claim 6, wherein the frequency is substantially infinite at the center of the extractor and substantially zero at the end of the extractor.

8. The apparatus of claim 1, further comprising:
   a projection system configured to project a patterned beam of radiation onto a radiation-sensitive substrate; and
   the liquid supply system.

9. A method of removing liquid from an object supported on a table and from a gap defined between the object and the table in an immersion lithographic apparatus, the method comprising:
   causing relative movement between the table and a liquid removal device including a first and a second outlet that are each connectable to an under pressure source to remove liquid through the first and the second outlet from the recess, the object or both, the first and the second outlets forming, respectively, a first and a second elongated extractor of a predetermined geometry, wherein the liquid removal device is arranged separate from a liquid confinement structure constructed and arranged to confine liquid in a space between an optical element of said immersion lithographic apparatus and the table, or the object or both; and
   activating one of the first and the second extractor to remove the liquid from the recess, the object or both based upon a position of the liquid removal device relative to the object.

10. The method of claim 9, wherein the one of the first and the second extractor is activated when a local part of an edge of the recess, which is being passed over by the one of the first and the second extractor, has, in a plane, its local tangent orientated at an angle between about 20° and 90° relative to the local tangent of the local part of the one of the first and the second extractor positioned over the local part of the edge.

11. The method of claim 9, wherein the first extractor is activated to remove liquid from a first half of the object and the second extractor is operated to remove liquid from a second half of the object.

12. The method of claim 9, wherein the geometry of the first and the second extractor is such that, at any given time, a tangent of a local part of the one of the first and the second extractor over a part of the recess which is being passed over is substantially about 90° to a local tangent of the part of the recess.

13. The method of claim 9, wherein the geometry of each of the first and the second extractor is sinuous.

14. An immersion lithographic apparatus comprising:
    a movable table including a recess;
    a liquid removal device including an outlet connectable to an under pressure source to remove liquid from the recess through the outlet, the outlet forming an elongated extractor of a predetermined geometry, wherein the liquid removal device is arranged separate from a liquid confinement structure constructed and arranged to confine liquid in a space between an optical element of said immersion lithographic apparatus and the table, or an object supported by said table or both; and
    a controller configured to cause relative movement between the table and the extractor to orient the extractor and/or table such that an overlapping part of an edge of the recess and of the extractor have in a plane a respective local tangent at an angle between about 20° and 90° to each other.

15. The apparatus of claim 14, wherein, during removal of liquid by the liquid removal device, the elongated extractor is oriented at a non-zero angle with respect to a direction of relative movement of an edge portion of the movable table and the elongated extractor.

16. The apparatus of claim 14, wherein the liquid removal device comprises another extractor of a predetermined geometry.

17. An immersion lithographic apparatus comprising:
    a movable table;
    a liquid removal device including an outlet connectable to an under pressure source configured to provide a negative pressure, the outlet forming an elongated extractor of a predetermined geometry, wherein the liquid removal device is arranged separate from a liquid confinement structure constructed and arranged to confine liquid in a space between an optical element of said immersion lithographic apparatus and the table, or an object supported by said table or both; and
    a controller configured to cause relative movement between the table and the elongated extractor to orient the extractor and/or table such that during removal of liquid by the liquid removal device, the elongated extractor is oriented at a non-zero angle with respect to a direction of relative movement of an edge portion of the movable table and the elongated extractor.

18. The apparatus of claim 17, wherein the liquid removal device comprises another extractor of a predetermined geometry.

19. The apparatus of claim 17, wherein the controller is configured to cause relative movement between the table and the extractor to orient the extractor and/or table such that an overlapping part of an edge of a recess defined in the movable table and of the extractor have in a plane a respective local tangent at an angle between about 20° and 90° to each other.

20. The apparatus of claim 17, further comprising
a projection system configured to project a patterned beam of radiation onto a radiation-sensitive substrate; and
the liquid supply system.

* * * * *